United States Patent [19]
Zhou et al.

[11] Patent Number: 6,114,852
[45] Date of Patent: Sep. 5, 2000

[54] METHOD EMPLOYING POINT SOURCE TO DETERMINE MOTION INDUCED ERRORS IN MR IMAGING

[75] Inventors: Xiaohong Zhou, Houston, Tex.; Graeme C. McKinnon, Hartland, Wis.

[73] Assignee: General Electric Company, Milwaukee, Wis.

[21] Appl. No.: 09/236,195

[22] Filed: Jan. 23, 1999

[51] Int. Cl.$^7$ ..................................................... G01V 3/00
[52] U.S. Cl. ......................... 324/306; 324/307; 324/309; 600/413
[58] Field of Search .................................. 324/306, 309, 324/307; 600/413, 419

[56] References Cited

U.S. PATENT DOCUMENTS

| | | | |
|---|---|---|---|
| 5,672,969 | 9/1997 | Zhou et al. | 324/309 |
| 6,009,341 | 12/1999 | Edelman | 600/413 |
| 6,031,374 | 2/2000 | Epatein et al. | 324/306 |
| 6,057,685 | 5/2000 | Zhou | 324/306 |

*Primary Examiner*—Christine K. Oda
*Assistant Examiner*—Brij B. Shrivastav
*Attorney, Agent, or Firm*—Skarsten Law Offices; Christian G. Cabou; Phyllis Y. Price

[57] ABSTRACT

A method is provided for determining errors in MR imaging which result from translational motion of an object. In accordance with the method, an MR point source is rigidly joined to the object in selected spatial relationship, and for movement in unison therewith. An MR system is operated to acquire an overall k-space signal which represents an image of the object and of the point source collectively, the overall k-space signal being contaminated by phase errors which result from the motion. A k-space data set which represents an image of the point source alone, and which remains contaminated by the phase errors, is filtered or separated out from the overall k-space signal. The MR system is operated in selected association with the point source to acquire a reference k-space data set, which represents an image of the point source alone but which is unaffected by the phase errors resulting from the motion. The reference k-space data set is then selectively compared with the filtered k-space data set, to determine the phase errors. Alternatively, the reference k-space data set can be replaced by a plurality of k-space alignment lines in parallel relationship to the phase-encoding axis.

20 Claims, 7 Drawing Sheets

$\phi_n$ (PHASE DIFFERENCE BETWEEN THE FILTERED K-SPACE DATA AND THE REFERENCE K-SPACE DATA FOR A GIVEN VIEW n)

LINEAR PHASE SLOPE: $\Delta x_n$

CONSTANT PHASE INTERCEPT: $K_{y_n} \Delta y_n$ $k_x$ (READ-OUT DIRECTION)

METHOD EMPLOYING POINT SOURCE TO DETERMINE MOTION INDUCED ERRORS IN MR IMAGING

BACKGROUND OF THE INVENTION

The invention disclosed and claimed herein generally pertains to a method for reducing artifacts in acquired magnetic resonance (MR) images, wherein the artifacts result from translational motion of a patient or other object of imaging. More particularly, the invention pertains to a method of such type wherein an MR point source is employed to acquire data which may be used to determine and correct phase errors resulting from such motion. Even more particularly, the invention pertains to a method of such type wherein a reference MR signal, derived from the point source, is compared with a k-space signal representing the point source when it is moving in unison with the object of imaging.

In conventional MR imaging, the scan time typically lasts a few seconds to several minutes. During this time, physiologic motion (e.g., cardiac, respiratory, gastrointestinal, and vascular motion), as well as a patient's gross movements (both voluntary and involuntary) can contaminate the spatially encoded MR signals, causing ghosting and blurring artifacts. Some of these motions, such as cardiac and respiratory, are periodic in nature. Other motions, such as involuntary motion of a patient, or uncontrolled movements of small children, are non-periodic and thus tend to be random or unpredictable.

In a conventional imaging technique such as spin warp, k-space is sampled by a series of lines parallel to the frequency-encoding axis ($k_x$-axis), with each line corresponding to a unique location along the phase-encoding axis ($k_y$-axis). Typically, each $k_x$-line is acquired with a single pulse sequence. The acquisition time per k-space line lasts only a few milliseconds. Motion during this short acquisition time, known as intra-view motion, is negligible and does not cause substantial image degradation. However, different k-space lines along the phase-encoding direction are acquired by repeating the pulse sequence with different phase-encoding gradients. The time span among these k-space lines can be hundreds of milliseconds or even seconds. Thus, the k-space data along the phase-encoding direction are particularly susceptible to motion. Such motion, referred to as view-to-view motion, can cause serious image artifacts.

In the past, a technique known as gating, wherein data acquisition is synchronized with motion, has been used to reduce motion-induced errors. Such technique is discussed, for example, by W. J. Rogers, Jr., and E. P. Shapiro in "Effect of RR interval variation on image quality in gated, two-dimensional, Fourier MR imaging", Radiology, vol. 186, pp. 883–887 (1993). However, the gating technique can only be used in connection with motion which is periodic. Moreover, such technique will significantly slow down data acquisition if the periods of successive motion cycles are comparatively long, e.g., on the order of seconds.

In another motion correction technique, known as navigator echo correction, an additional echo is acquired in the same pulse sequence that acquires the k-space data. This echo, referred to as a navigator echo, is used to determine the instantaneous position of the object when the sequence is played out, and is subsequently used to retrospectively correct the k-space data acquired by the same sequence, or to prospectively re-acquire the motion-contaminated k-space data if motion exceeds a pre-determined threshold. The navigator technique is described, for example, by R. L. Ehman and J. P. Felmlee, Radiology, vol. 173, pp. 255–263 (1989), and by Z. W. Fu, et al., Magn. Reson. Med., vol. 34, pp. 746–753 (1995). The use of navigator echoes always requires additional data which can lead to longer imaging times.

Deficiencies of the prior art cited above are addressed, at least in part, by means of the MR imaging technique disclosed in U.S. patent application Ser. No. 08/987,594, filed Dec. 9, 1997 by Xiaohong Zhou, one of the co-inventors herein. Such application is commonly assigned herewith, to the General Electric Company, and the technique thereof is known as MORKA (motion reduction by k-space alignment). In accordance with such technique, two (or more) additional k-space lines or signals are acquired in a direction orthogonal to the nominal k-space data. From the two additional k-space signals, two simultaneous equations are obtained, for use in calculating the translational spatial displacements $\Delta x_n$ and $\Delta y_n$, for each phase encoding step (or view) n. This technique has been found to work in certain cases, particularly where the two additional signals are acquired close to the center of k-space. However, when the size of the imaged object is comparable to the imaging field-of-view (FOV), the k-space imaging signal usually decays very fast. Away from the k-space center, therefore, the phase calculation is subject to noise perturbations, leading to erroneous results. Even when the signal-to-noise ratio (SNR) is relatively high, the k-space signal can have nodal points with zero amplitudes, making the phase uncertain. These problems have limited the use of the MORKA technique.

To date such techniques have mainly been discussed with respect to two dimensional (2D) imaging, in which case only the in-plane translational motion can be corrected. However the concepts invoked can also be applied to three dimensional (3D) imaging, whereby the full 3D motion can potentially be corrected.

SUMMARY OF THE INVENTION

The invention generally pertains to a method for acquiring an MR image of an object which is disposed to experience translational motion. In accordance with the invention, an MR point source is disposed in selected spatial relationship with the object, and is joined or otherwise disposed for movement in unison therewith. An MR system is operated to acquire an overall k-space signal which represents an image of the object and of the point source collectively, the overall k-space signal being contaminated by phase errors resulting from the motion. The overall k-space signal is filtered in the spatial domain to provide a filtered k-space data set which represents an image of the point source alone. The MR system is also operated in selected association with the point source to acquire a reference k-space data set, which likewise represents an image of the point source alone, but is unaffected by the phase errors resulting from the translational motion. The filtered k-space data set and the reference k-space data set are selectively compared, to determine the phase errors.

Preferably, the step of filtering the overall k-space signal comprises applying a Fourier transform thereto, to generate an image which represents the object and the point source collectively, in real space. A region is selected in real space which contains the point source and excludes the object. The image within the selected region is then inversely Fourier transformed to generate the filtered k-space data set representing the point source alone.

In one embodiment of the invention, the MR system is operated to acquire the reference k-space data set while the point source is immovably located at a specified reference position with respect to the MR system. Such data acquisition takes place in the absence of the object. In an alternative embodiment of the invention, acquisition of the reference k-space data set comprises rapidly acquiring a plurality of k-space "alignment" lines, which are parallel to each other and perpendicular to the nominal k-space lines. Each of the alignment lines comprises a set of data points, the location of each data point of a given alignment line coinciding with the location of one of the data points included in the nominal k-space data set. The k-space alignment lines are individually Fourier transformed in one dimension to obtain a set of projections. In the projections, the point source is separated from the object, and then inversely Fourier transformed to obtain a set of filtered k-space alignment lines. Data points along the filtered k-space alignment lines are compared with the corresponding data points in the filtered nominal k-space lines to obtain the phase errors. These phase errors are then removed from the nominal k-space data set to achieve motion artifact reduction. In accordance with the invention, it has been recognized that there are significant benefits in employing a point source to acquire a signal in k-space, for use in correcting motion-induced phase errors. In particular, such signal decays slowly, even at the periphery of k-space, and therefore provides a comparatively high SNR. Such signal is also less susceptible to zero amplitude nodal points of k-space signals.

DETAILED DESCRIPTION OF THE PREFERRED EMBODIMENT

Figure 1:
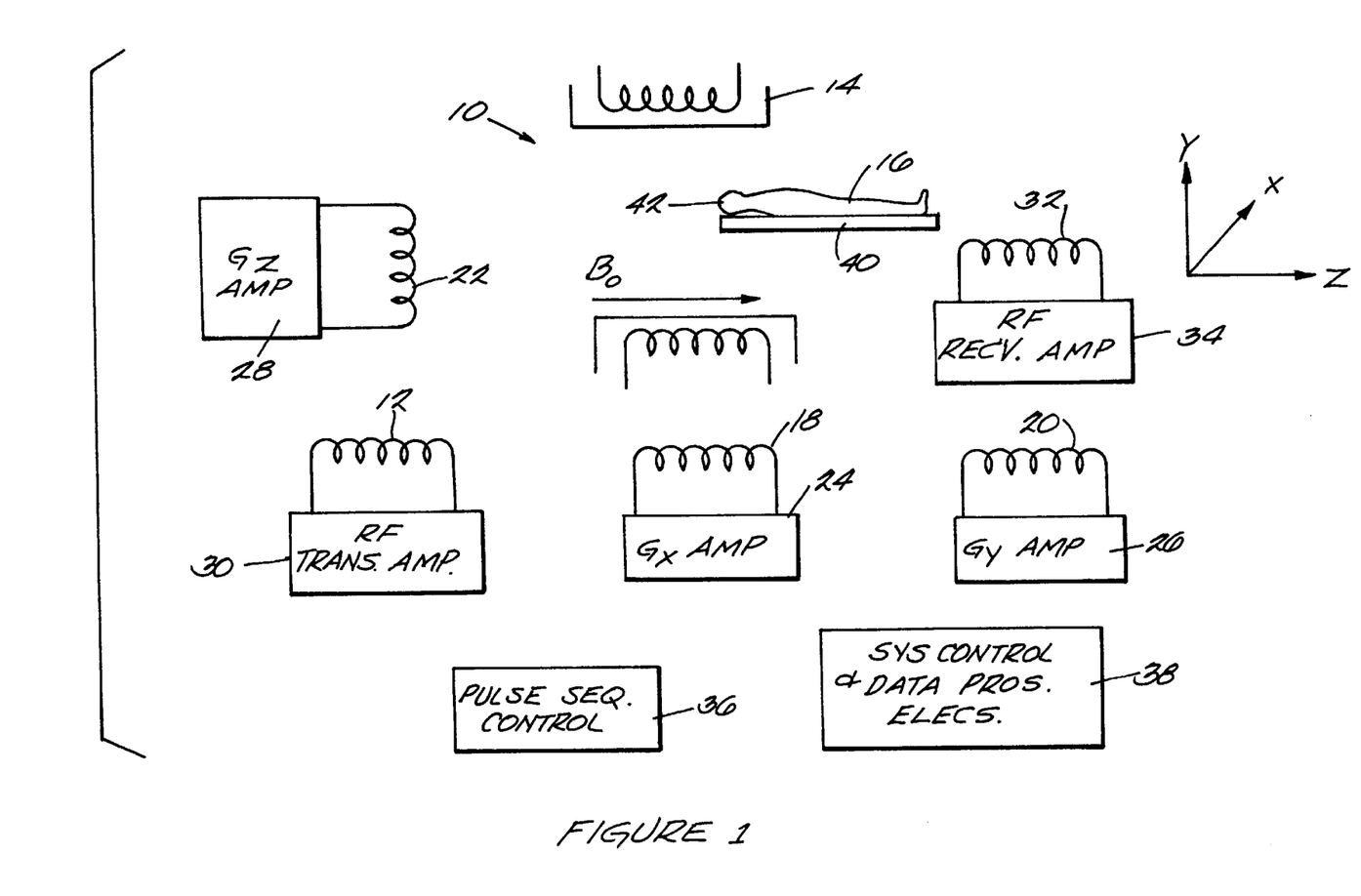
FIG. 1 is a schematic diagram showing basic components of an MR system for use in practicing embodiments of the invention.

Referring to FIG. 1, there are shown the basic components of an MR system 10 which may be operated to acquire MR data, and also to correct motion-induced errors in the data as described herein. System 10 includes an RF transmit coil 12, as well as a magnet 14 for generating a main or static magnetic field $B_0$ in the bore of a cylindrical magnet. RF coil 12 is operated to transmit RF excitation signals into a patient or other object of imaging 16 supported in the magnet bore by means of a pallet 40 or the like, in order to produce MR signals. System 10 further includes gradient coils 18, 20 and 22 for generating $G_x$, $G_y$, and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30.

Referring further to FIG. 1, there is shown system 10 provided with an RF coil 32, which is operated in association with a receive amplifier 34 to acquire MR signals from patient 16. System 10 is further provided with a pulse sequence control 36, which is operated to control the RF and gradient amplifiers, and to thereby generate pulse sequences to produce and acquire sets of MR signals. System 10 also includes computation and processing electronics 38, for applying the method of the invention to correct errors in the acquired data, wherein the errors result from translational motion of the patient 16. The construction, functions, and interrelationships of the respective components of MR system 10 are well known and described in the prior art, such as in U.S. Pat. No. 5,672,969, issued Sep. 30, 1997 to Zhou et al. It is anticipated that an embodiment of the invention could be particularly useful in MR imaging of the head 42 of patient 16. However, the invention is by no means limited thereto.

In one embodiment of the invention, as described hereinafter, MR system 10 is further provided with a small RF coil surrounding a point source.

Figure 2A:
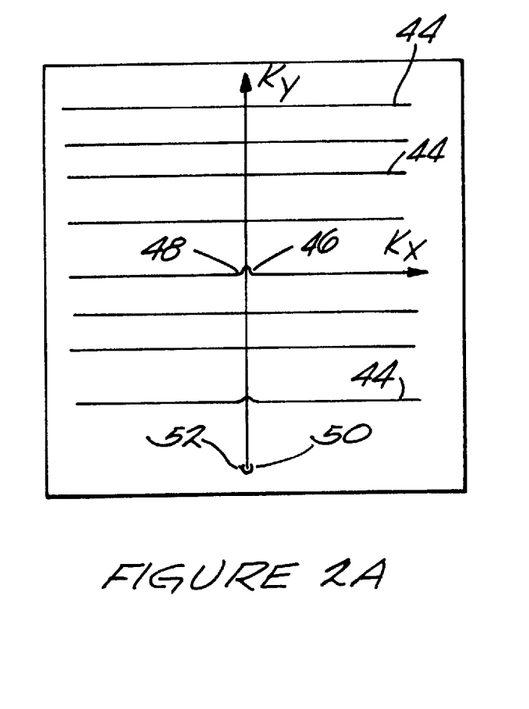
FIGS. 2A, 2B and 3 are schematic diagrams illustrating certain characteristics of an MR signal in k-space which help in comprehending the techniques in the invention.

As stated above, when the size of an object of MR imaging is comparable to the image field of view, the k-space signal tends to decay very rapidly. Accordingly, phase calculations remote from the center of k-space are subject to errors resulting from noise perturbations. This situation is illustrated in FIG. 2A, which shows lines 44 of the twodimensional k-space data, acquired from an object of imaging. MR signal component 46, located at a line 48 proximate to the k-space center, is comparatively strong. In contrast, MR signal component 50, located at the edge or periphery of k-space line 52, is comparatively weak. The substantial difference in signal strengths between signal components 46 and 50 is emphasized in FIG. 2B.

As is further well known, the amplitude |S| of an MR signal varies in the k-space, and may have zero values, or nodal points, at certain locations. This is illustrated in FIG. 3 where an arbitrary k-space line exhibits nodal points 54.

Figure 2B:
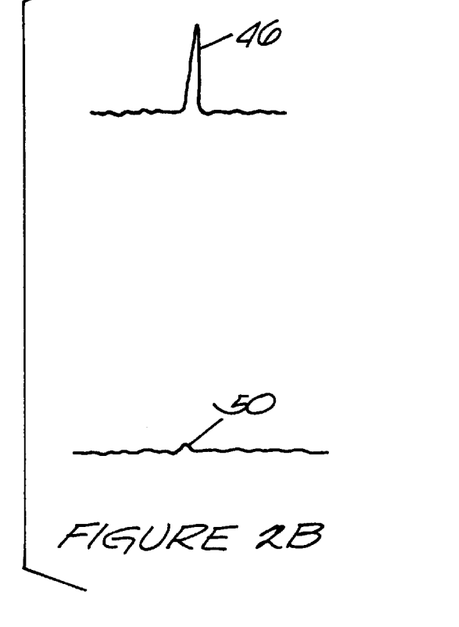
Figure 3:
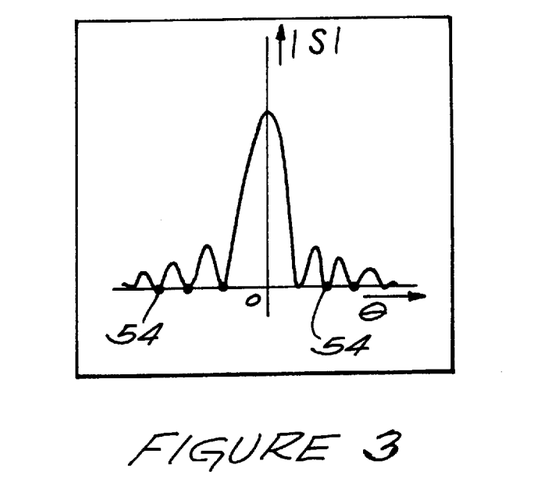
Figure 4:
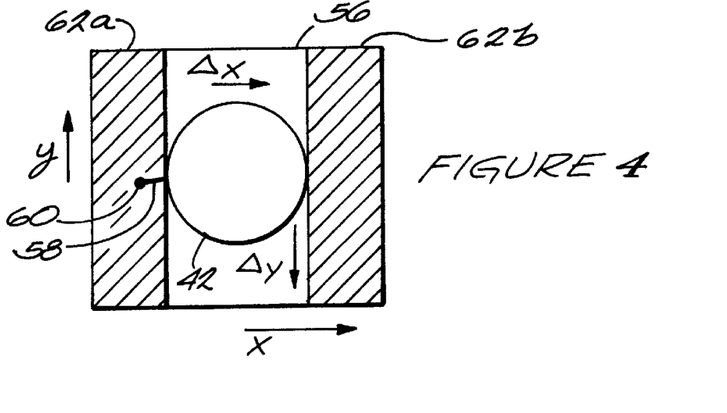
FIG. 4 is a schematic diagram showing an MR point source joined to an object of imaging for an embodiment of the invention.

FIGS. 2 and 3 emphasize that certain components of k-space signal which has been derived from an object of imaging, and in particular the components thereof which are located at the periphery of k-space or at the vicinity of a nodal point, may not reliably be used for calculating the motion-induced phase errors. In recognition of this situation, and in accordance with the invention, FIG. 4 shows an MR point source 60 which is rigidly joined to an object of MR imaging. Such object lies within a field of view 56, and comprises, for example, the head 42 of patient 16. Object 42 is subject to translational motion during acquisition of MR image data, so that it is displaced by $\Delta x$ with respect to the x-axis, and by $\Delta y$ with respect to the y-axis, where x and y are the logical readout and phase-encoding axes in the imaging plane, respectively, and may or may not coincide with the physical X and Y axes. This displacement introduces errors in the acquired image data, which may be corrected by means of the method described herein. For simplicity, the 2D imaging situation is discussed, and motion of object 42 is limited to lie within the two dimensions of the imaging plane. However, in the event of a 3D image acquisition, the methods of the invention could readily be extended to correct errors resulting from three dimensional object displacement.

Referring further to FIG. 4, there is shown point source 60 rigidly joined or attached to object 42 by means of a stiff, comparatively short rod 58. Accordingly, the point source 60 moves in unison with object 42, so that the same translational motion which is experienced by object 42 is also applied to point source 60. Point source 60 usefully comprises a small phantom, such as a container of water, which has the same MR spin species as object 42. The dimensions of point source 60 should be comparatively small (e.g., 1–3 pixels in each dimension), and the point source should be capable of producing k-space signals above the noise level. Also, the spacing between object 42 and point source 60 is relatively small, compared to the RF coils of MR system 10 or the like, so that an RF excitation signal applied thereby to object 42, to produce and receive MR signals, will likewise produce and receive MR signals with respect to point source 60.

By placing point source 60 in proximate relationship with object 42 as shown in FIG. 4, the acquired MR data have an associated image function I(x,y), which represents images of the object and point source, collectively. The image function can be mathematically expressed as $I(x,y)=I_{ps}+I_{obj}$, where $I_{ps}$ and $I_{obj}$ are the image functions of the point source and the object, respectively. Similarly, the k-space signal $S(k_x, k_y)$ of the acquired MR data can be expressed as $S(k_x, k_y)=S_{ps}+S_{obj}$.

The amplitude of $S_{ps}$, the k-space signal for the point source, is constant if the point source is no larger than one pixel (on the order of ~1 mm) in size. If the point source is larger than one pixel, k-space signal $S_{ps}$ will be amplitude modulated. However, such modulation will result in only slow signal decay, provided the point source is small compared to the field of view. As described hereinafter in further detail, the slow decay of the point source k-space signal can be readily employed to correct motion-induced phase errors in the presence of noise, even in regions distant from the k-space center. The constant or slowly decaying point source signal may also be readily employed for phase error calculation near the nodal points of k-space signal $S_{obj}$, described above in connection with FIG. 3. However, in order to achieve these benefits, the point source signal $S_{ps}$ must be separated from the overall k-space signal $S(k_x, k_y)$.

In the arrangement shown in FIG. 4, it is assumed that a conventional MR imaging sequence, such as spin warp or spin echo, is used to acquire a set of MR data points pertaining to object 42 and point source 60, which is represented by the signal $S(k_x, k_y)$. It is further assumed that the imaging sequence has a readout direction oriented along the x-axis, and a phase-encoding direction oriented along the y-axis. For such arrangement, in order to separate signal $S_{ps}$ from the overall signal $S(k_x, k_y)$ in accordance with an embodiment of the invention, the point source 60 attached to object 42 should be located in a spatial region 62*a*, as shown in FIG. 4. Alternatively, while not shown, the point source 60 could be located in a spatial region 62*b*. Either of such locations ensures that the point source 60 will not overlap object 42 with respect to the x-axis. That is, point source 60 is thereby positioned so that no line directed along the yaxis will intersect both point source 60 and any point of object 42.

Figure 5:
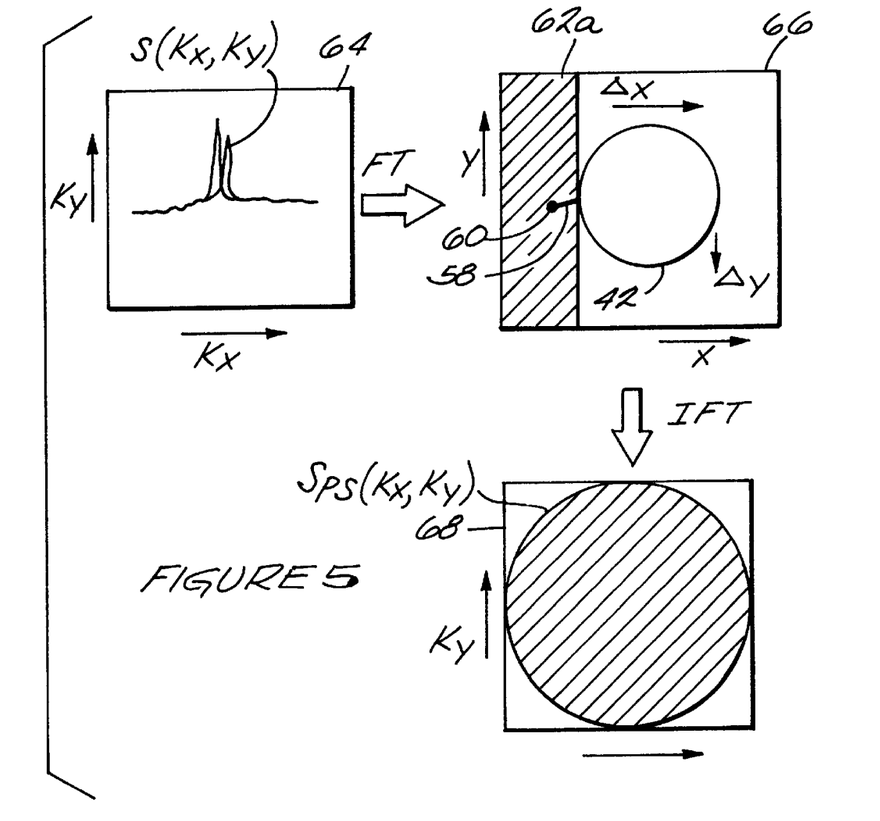
FIG. 5 is a schematic diagram showing steps in acquiring a point source k-space signal which has been affected by motion.

Referring to FIG. 5, there is shown a very useful procedure for separating point source k-space signal $S_{ps}$ from the over-all signal $S(k_x, k_y)$. The overall signal is depicted in FIG. 5 in k-space 64. FIG. 5 further shows a Fourier transform (FT) applied to the signal $S(k_x, k_y)$, to provide an image function I(x,y), as described above. The image function defines the collective image representation of object 42 and point source 60, which is shown in FIG. 5 as block 66. It will be readily apparent that such representation of block 66 is identical to FIG. 4. As stated above in connection with FIG. 4, point source 60 lies within region 62*a* of field of view 56, which does not include any portion of object 42. Thus, the point source function $I_{ps}$ is separable from the object function $I_{obj}$.

The relationship between I(x,y) and $S(k_x, k_y)$ is set forth as follows:

$$S(k_{xm}, k_{yn}) = \iint I(x,y) e^{-i(k_{xm}x + k_{yn}y)} dxdy \qquad \text{Eqn. (1)}$$

In Equation (1), $k_{xm}$ and $k_{yn}$ denote discrete data point locations along the $k_x$- and $k_y$-axes, respectively. Since I(x,y) can be spatially separated into an object portion $I_{obj}(x,y)$ and a point source portion $I_{ps}(x,y)$, from the relationship given in Equation (1), the point source k-space signal $S_{ps}$ can also be separated from the over-all signal $S(k_x, k_y)$, by applying an inverted Fourier transform (IFT) to $I_{ps}(x,y)$. Such signal is depicted in FIG. 5 in a k-space 68.

As stated above, point source 60 moves in unison with object 42. Accordingly, k-space signal $S_{ps}$ is contaminated by $\Delta x$ and $\Delta y$, the translational displacements of object 42. If $\Delta x_n$ and $\Delta y_n$ are the spatial displacements for the nth phase-encoding view in the read-out and the phase-encoding directions respectively, of signal $S_{ps}$ location along the x-axis is shifted to x', where $x'=(x-\Delta x_n)$. Similarly, location along the y-axis is shifted to y', where $y'=(y-\Delta y_n)$. Accordingly, if $S_{fps}(k_{xm}, k_{yn})$ is the k-space signal of point source 60 when the point source is fixed in position, so that it is prevented from moving, the relationship between $S_{PS}$ and $S_{fps}$ is given by the following equation:

$$S_{ps}(k_{xm}, k_{yn}) = \iint I_{ps}(x',y') e^{-i(k_{xm}x' + k_{yn}y')} dx'dy' = e^{i(k_{xm}\Delta x_n + k_{yn}\Delta y_n)} S_{fps}(k_{xm}, k_{yn}) \qquad \text{Eqn. (2)}$$

Figure 6:
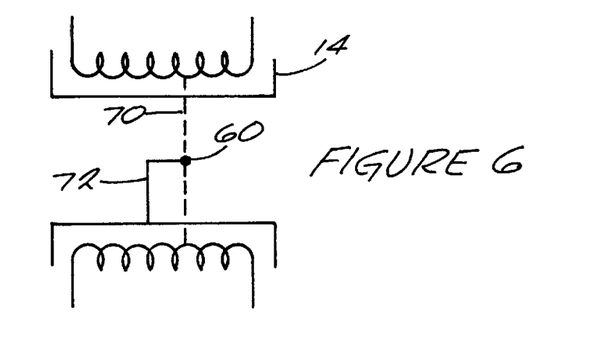
FIG. 6 is a schematic diagram showing an arrangement of MR system components for use in acquiring a reference point source MR signal, in accordance with an embodiment of the invention.

In an embodiment of the invention, the k-space signal $S_{fps}$ is acquired for use as a reference. Thus, referring to FIG. 6, there is shown point source 60 immovably held in place within the bore of magnet 14, in a known reference position, either prior to or after acquisition of MR data $S(k_{xm}, k_{yn})$, pertaining to object 42 and point source 60 together as described above. Preferably, point source 60 is immovably positioned mid-way along the isocenter 70 of magnet 14, by means of a member 72 or the like which does not affect MR imaging. FIG. 6 further shows the bore of magnet 14 containing only point source 60. If components of MR system 10 are operated to acquire MR data of point source 60 while the point source is in such condition, i.e., while it is immovable and alone in magnet 14, the resulting MR data comprises the desired k-space point source reference signal $S_{fps}$ for Equation (2).

In Equation (2), spatial errors $\Delta x_n$ and $\Delta y_n$ are constant for the nth view. Moreover, Equation (2) indicates that the effect of the spatial displacements $\Delta x_n$ and $\Delta y_n$ is to introduce two phase errors in each k-space line along the $k_x$-axis, i.e. a constant phase error $e^{ik_{yn}\Delta y_n}$, and a linear phase error $e^{ik_{xm}\Delta x_n}$.

Figure 7:
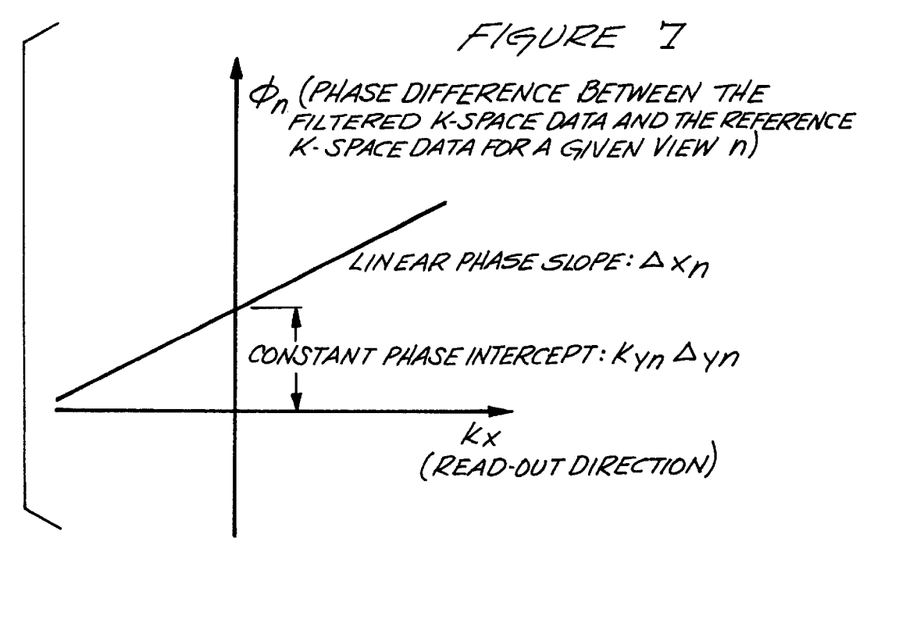
FIG. 7 is a schematic diagram which compares the phases of respective lines of k-space data from a reference point source MR signal, and from a point source signal affected by motion.

To calculate these phase errors, a phase difference is first taken between $S_{fps}$ and $S_{ps}$ for each k-space line. From the phase difference, a linear regression is performed with respect to the $k_x$-axis. The intercept of the linear regression corresponds to the constant phase error $e^{ik_{yn}\Delta y_n}$, and the slope reflects the linear phase error $e^{iK_{xm}\Delta x_n}$, as illustrated in FIG. 7. After these errors are determined, motion-induced errors can be removed from each k-space line pertaining to object 42. To implement such procedure for a given k-space line, the constant and linear phases are subtracted from $S_{obj}$, the k-space signal for the object, prior to image reconstruction.

Figure 8:
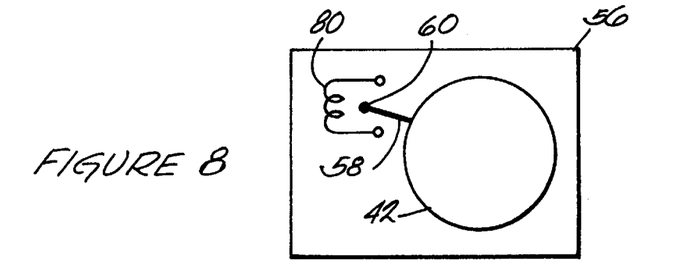
FIG. 8 is a schematic diagram showing a point source coil for an embodiment of the invention.

As stated above, to use the technique of the invention $S_{ps}$ must be above the noise level for every pixel in k-space. In cases where this requirement is difficult to satisfy, a separate RF point source coil with improved sensitivity can be used to acquire the signals from the point source 60. Referring to FIG. 8, there is shown point source 60 placed within a very small RF receive coil 80. When an RF excitation signal is applied to object 42 and point source 60, the MR signals thereby produced in point source 60 are detected by point source coil 80, with a high level of sensitivity.

Figure 9:
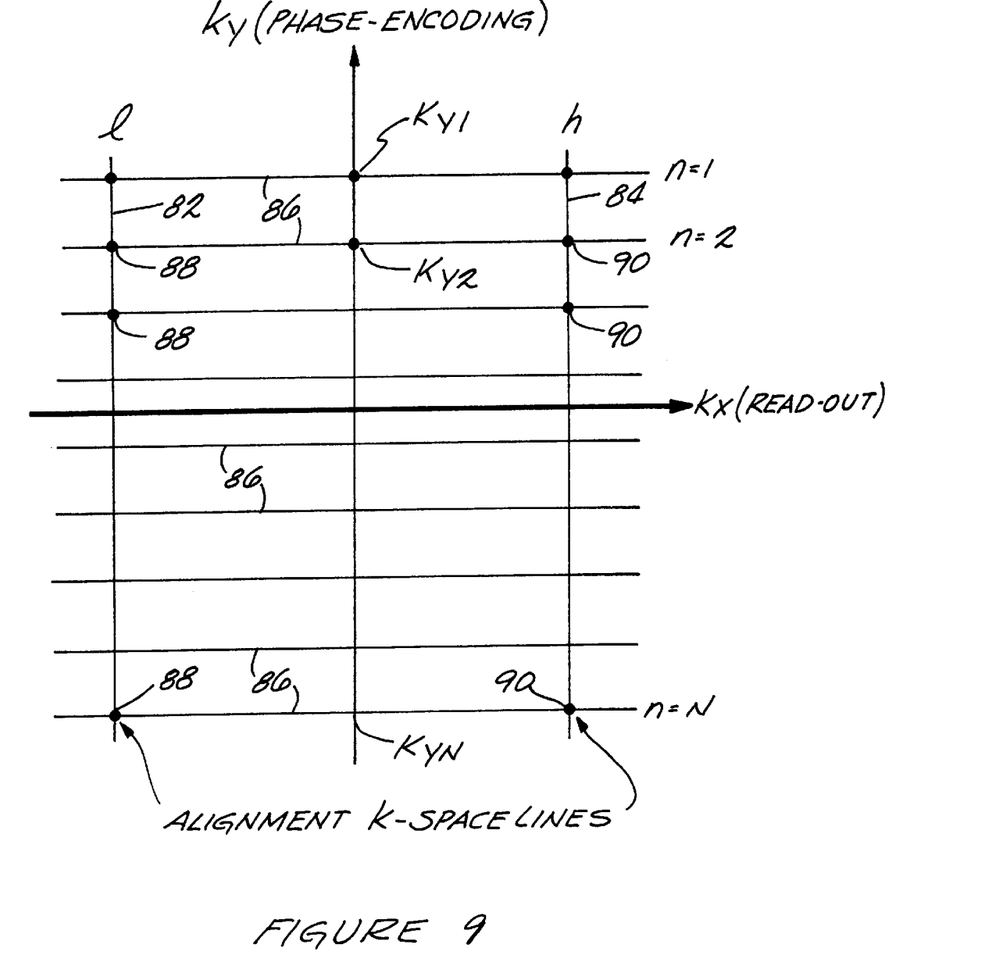
FIG. 9 is a k-space diagram useful for illustrating an alternative embodiment of the invention.

In a second embodiment of the invention, an alternative approach is used to acquire reference MR data, for comparison with the motion contaminated point source signal $S_{ps}$. In accordance therewith, two or more additional k-space lines, referred to as alignment lines, are rapidly acquired parallel to the phase-encoding or $k_y$-axis. More specifically, each alignment line comprises a set of MR data points or samples acquired along a linear trajectory which is parallel to the phase-encoding direction, and is located at a specified position along the readout or frequency-encoding axis. Respective data samples for each alignment line are taken wherever the line intersects the k-space lines which are parallel to the readout direction. Thus, referring to FIG. 9, there are shown alignment lines 82 and 84, wherein the lines are located at positions l and h, respectively, along the readout axis $k_x$, and wherein both lines are parallel to the phase-encoding axis $k_y$. FIG. 9 further shows N k-space lines 86, parallel to the readout direction, which comprise a portion of the k-space lines which are denoted by point source signal $S_{ps}$, and are depicted in k-space 68 of FIG. 5. The nth line 86 intersects the ky axis at $k_{yn}$.

Referring further to FIG. 9, there is shown line 82 intersecting each of the lines 86 at points 88, that is, at locations $k_{yn}$ along the phase-encoding axis. The set of MR data samples acquired at all such points, associated with alignment line 82, is usefully represented as an MR signal $S_l(k_{yn})$. In like manner, FIG. 9 shows line 84 intersecting each of the lines 86 at points 90. The set of MR data samples acquired at all such points, associated with alignment line 84, is usefully represented as an MR signal $S_h(k_{yn})$. It is seen that data points 88 and 90 coincide with, or are identical to, portions of the sample points comprising the point source k-space signal $S_{ps}(k_{xm}, k_{yn})$.

As stated above, the data sets $S_l(k_{yn})$ and $S_h(k_{yn})$ are very rapidly acquired. In particular, each such set is acquired during a narrow time window which is no greater than on the order of several milliseconds. Moreover, the total time required to acquire both sets can be less than on the order of a few tens of milliseconds. Because the acquisition time is so short, the translational motion has only a negligible effect on the alignment line data sets. Accordingly, such data sets, hereinafter referred to as correction data sets, are available for use in determining and correcting the motion induced errors in the acquired point source and object k-space data.

To acquire correction data sets $S_l$ and $S_h$ in a sufficiently short period of time, one of several conventional techniques may be employed. For example, a single-shot echo planar imaging (EPI) technique or a single-shot fast spin echo (FSE) with two or more echoes can be used. Alternatively, a gradient echo sequence with two phase-encoding gradients can be employed, as long as the two acquisitions are accomplished within a narrow time window during which motion is negligible.

Figure 10:
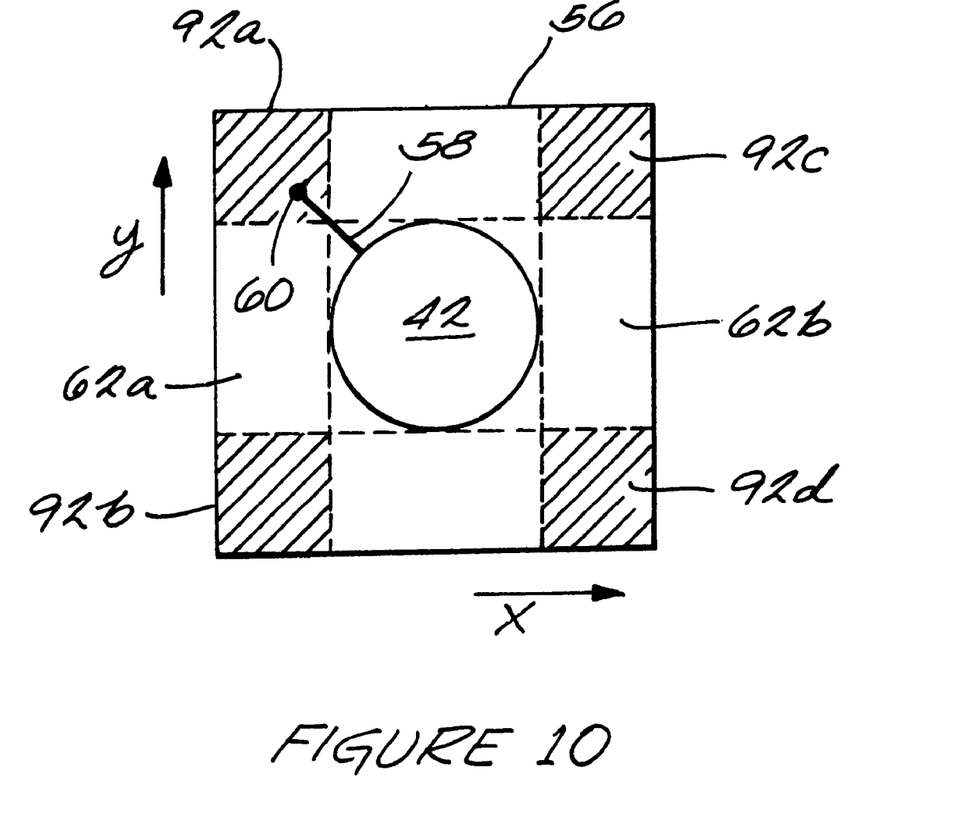
FIG. 10 is a schematic diagram showing an MR point source joined to an object of imaging for the embodiment of FIG. 9.

In acquiring the correction data sets $S_l$ and $S_h$, it is necessary to ensure that the point source 60 will not overlap object 42 with respect to either the x-axis or the y-axis. Thus, referring to FIG. 10, there is shown point source 60 positioned with respect to object 42 so that the point source lies within a region 92a of FOV 56. Accordingly, no line directed along either the x-axis or y-axis will intersect both point source 60 and any point of object 42. Such result could alternatively be achieved by placing point source 60 in one of the regions 92b–92d, 92a and 92b comprising sub-regions of region 62a, and 92c and 92d comprising sub-regions of region 62b. To obtain the correction data sets arising from only the point source, k-space data are first taken from both the object 42 and the point source 60 along the alignment lines 82 and 84. The two k-space lines are then individually Fourier transformed to obtain the projections along the y-axis. From the projections, the point source can be separated from the object, and the portion corresponding to the point source is inversely Fourier transformed to produce $S_l$ and $S_h$.

The correction data sets $S_l$ and $S_h$ can be mathematically expressed as follows:

$$S_l(k_{yn}) = \int\int I_{ps}(x, y) e^{-i(k_{xl}x + k_{yn}y)} dxdy \qquad \text{Eqn. (3)}$$

$$S_h(k_{yn}) = \int\int I_{ps}(x, y) e^{-i(k_{xh}x + k_{yn}y)} dxdy \qquad \text{Eqn. (4)}$$

A subset of the data samples of the point source signal k-space signal $S_{ps}(k_{xm}, k_{yn})$, taken at respective points 88 shown in FIG. 9, comprises a motion contaminated signal $S'_l(k_{yn})$. From Eqns. (2) and (3), $S'_l(k_{yn})$ can be represented as follows:

$$S'_l(k_{yn}) = e^{i(k_{xl}\Delta x_n + k_{yn}\Delta y_n)} S_l(k_{yn}) \qquad \text{Eqn. (5)}$$

Similarly, a subset of the data samples of the point source k-space signal $S_{ps}(k_{xm}, k_{yn})$, taken at respective points 90 shown in FIG. 9, comprises a motion-contaminated signal $S'_h(k_{yn})$, which can be represented as follows:

$$S'_h(k_{yn}) = e^{i(k_{xh}\Delta x_n + k_{yn}\Delta y_n)} S_h(k_{yn}) \qquad \text{Eqn. (6)}$$

From Eqn. (5), it is seen that the effect of spatial displacements $\Delta x_n$ and $\Delta y_n$ is to introduce a phase difference or phase error $\alpha_n$ between the motion correction signal $S_l(k_{yn})$ and the motion contaminated signal $S'_l(k_{yn})$ corresponding thereto. Such phase difference, from Eqn. (5), is given as follows:

$$\alpha_n = k_{xl}\Delta x_n + k_{yn}\Delta y_n \qquad \text{Eqn. (7)}$$

Since $S_l(k_{yn})$ and $S'_l(k_{yn})$ are acquired, the actual value of an can be derived as follows:

$$\alpha_n \equiv arg[S_l(k_{yn})/S'_l(k_{yn})] \qquad \text{Eqn. (8)}$$

In Eqn. (8), the symbol arg represents the operation to obtain the phase angle of the complex numbers within the brackets, which involves dividing one complex number by the other.

In like manner, the spatial displacements $\Delta x_n$ and $\Delta y_n$ introduce a phase difference $\beta_n$ between signals $S_h(k_{yn})$ and $S'_h(k_{yn})$, which is given by Eqn. (6) as follows:

$$\beta_n = k_{xh}\Delta x_n + k_{yn}\Delta y_n \qquad \text{Eqn. (9)}$$

The actual value of $\beta_n$ can be derived as follows:

$$\beta_n \equiv arg[S_h(k_{yn})/S'_h(k_{yn})] \qquad \text{Eqn. (10)}$$

Equations (7) and (9) provide two equations wherein, for a fixed or given value of view n, the only two unknowns are $\Delta x_n$ and $\Delta y_n$. From Eqns. (7) and (9), $\Delta x_n$ and $\Delta y_n$ can be obtained as follows:

$$\Delta x_n = [\alpha_n - \beta_n]/[k_{xl} - k_{xh}] \qquad \text{Eqn. (11)}$$

$$\Delta y_n = [\alpha_n - k_{xl}\Delta x_n]/k_{yn} \qquad \text{Eqn. (12)}$$

Since $k_{xl}$, $k_{xh}$, and $k_{yn}$ are all known, $\Delta x_n$ and $\Delta y_n$ can be readily obtained by solving Eqns. (11) and (12). Then, with known $\Delta x_n$ and $\Delta y_n$, the motion-induced errors can be removed from the overall motion-contaminated signal $S(k_{xm}, k_{yn})$.

Figure 11:
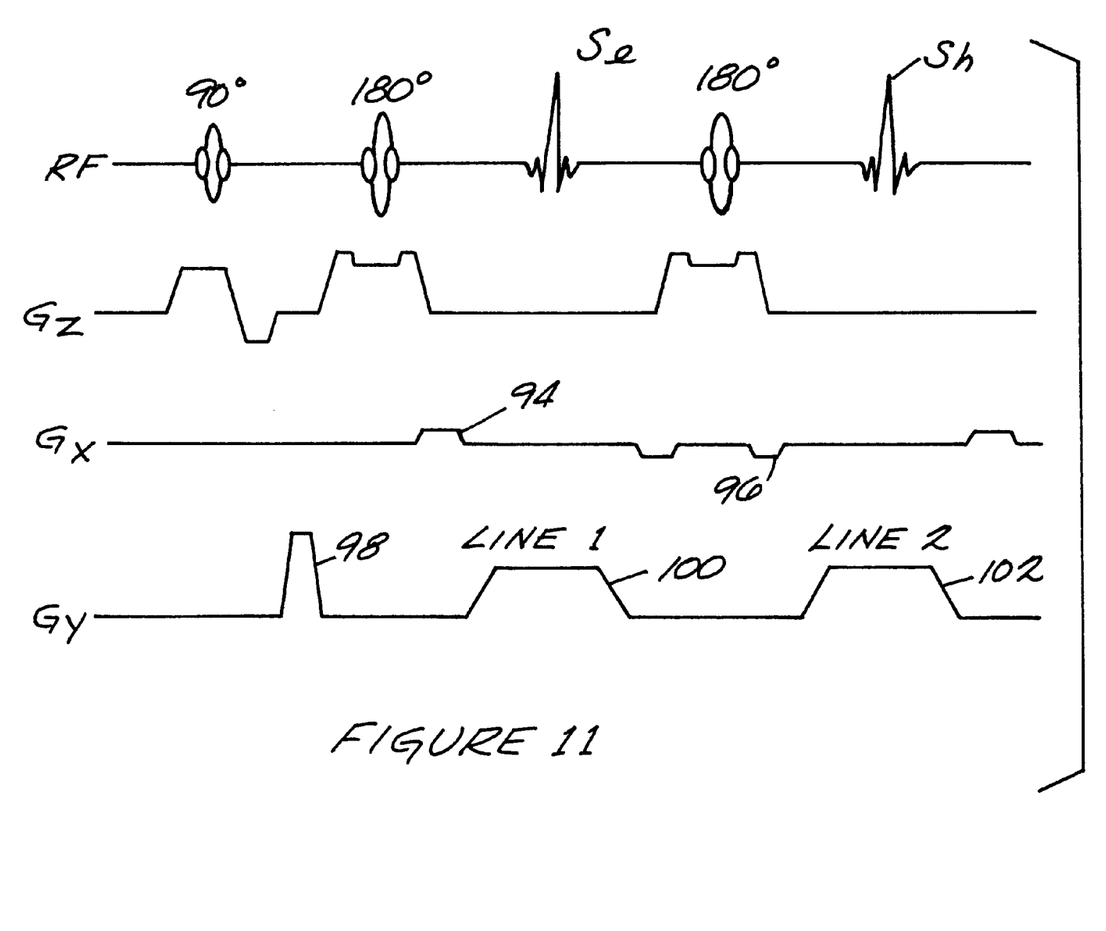
FIG. 11 is a pulse sequence diagram for the embodiment of FIG. 9.

The data for the correction signals $S_l$ and $S_h$ can be acquired before, during or after acquisition of data for the over-all k-space signal $S(k_x, k_y)$. Referring to FIG. 11, there is shown a pulse sequence useful for acquiring the correction signals $S_l$ and $S_h$. The RF waveform shown therein comprises a 90° pulse followed by a first 180° refocusing pulse, which generates the MR correction signal $S_l$. Thereafter, a second 180° refocusing pulse occurs, which generates the MR correction signal $S_h$.

Referring further to FIG. 11, there is shown $G_z$ generating a slice-select gradient pulse, along the z-axis. The $G_x$ gradient provides phase-encoding pulses 94 and 96, to select locations at k-space positions at l and h, respectively. The $G_y$ gradient provides a pre-phasing pulse 98 and readout pulses 100 and 102, in coincident relationship with signals $S_l$ and $S_h$, respectively.

Obviously, other modifications and variations of the present invention are possible in light of the above teachings. It is therefore to be understood that within the scope of the disclosed concept, the invention may be practiced otherwise than as specifically described.

What is claimed is:

1. A method for acquiring an MR image of an object which is disposed to experience translational motion, said method comprising the steps of:
  disposing an MR point source in selected spatial relationship with said object, and for movement in unison therewith;
  operating an MR system to acquire an overall k-space signal which represents an image of said object and of said point source, collectively, said overall k-space signal being contaminated by phase errors resulting from said motion;
  filtering said overall k-space signal to provide a filtered k-space data set which represents an image of said point source alone;
  operating said MR system in selected association with said point source to acquire a reference k-space data set which represents an image of said point source alone, and which is unaffected by said phase errors resulting from said motion; and
  comparing said filtered k-space data set and said reference k-space data set to determine said phase errors.

2. The method of claim 1 wherein said filtering step comprises:
  applying a Fourier transform to said overall k-space signal to generate an image function representing said object and said point source, collectively, in real space;
  defining a region in said real space which contains said point source, and excludes said object; and
  applying an inverse Fourier transform to said image function which is spatially limited to said region, in order to generate said filtered k-space data set.

3. The method of claim 2 wherein acquisition of said reference k-space data set comprises:
  operating said MR system to acquire said reference k-space data set while said point source is immovably located at a specified reference position with respect to said MR system.

4. The method of claim 3 wherein:
  said comparing step comprises determining constant and linear phase errors between each k-space line of said reference k-space data set, and k-space lines respectively corresponding thereto of said filtered k-space data set.

5. The method of claim 4 wherein:
  said constant and linear phase errors are respectively determined by taking the phase difference between said reference k-space data set and said filtered k-space data set for each k-space line, and performing a linear regression with respect to a specified k-space axis, the intercept of said linear regression corresponding to said constant phase error, and the slope of said linear regression providing said linear phase error.

6. The method of claim 5 wherein:
  said constant and linear phases are respectively subtracted from a k-space signal representing said object prior to constructing an image of said object.

7. The method of claim 6 wherein:
  said point source is positioned in relation to said object so that said point source will not overlap said object, with respect to a specified spatial axis, during acquisition of said overall k-space signal representing said object and said point source, collectively.

8. The method of claim 1 wherein:
  respective phase error values determined during said comparing step are used to correct a k-space signal representing said object; and
  said corrected k-space signal is used to construct an image of said object.

9. The method of claim 2 wherein acquisition of said reference k-space data set comprises filtered k-space alignment lines which are derived from a plurality of k-space alignment lines acquired in parallel relationship to the phase-encoding axis of said k-space, each of said alignment lines comprising a set of data points, the location of each data point of a given alignment line coinciding with the location of one of the data points included in said filtered k-space data set.

10. The method of claim 9 wherein:
  said filtered k-space alignment lines are obtained by individually Fourier transforming said k-space alignment lines to obtain projections, from which said point source is separated from said object, projections corresponding to said point source being inversely Fourier transformed.

11. The method of claim 10 wherein:
  said point source is positioned in relation to said object so that said point source will not overlap said object, with respect to two specified spatial axes in orthogonal relationship with one another, during acquisition of said overall k-space signal representing said object and said point source, collectively.

12. The method of claim 2 wherein:
  an RF point source coil is placed in proximate relationship with said point source to acquire k-space signals from said point source with selectively enhanced sensitivity.

13. Apparatus for acquiring an MR image of an object which is disposed to experience translational motion, said apparatus comprising:

an MR point source;

means for joining said point source to said object, in selected spatial relationship, for movement in unison therewith;

a set of MR components disposed to acquire an overall k-space signal which represents an image of said object and of said point source, collectively, said overall k-space signal being contaminated by phase errors resulting from said motion, said set of MR components being further provided for use in acquiring a reference k-space data set which represents an image of said point source alone, and which is unaffected by said phase errors resulting from said motion; and an MR signal processing device for filtering said overall k-space signal, in order to generate a filtered k-space data set which represents an image of said point source alone, and for comparing said filtered k-space data set and said reference k-space data set, in order to determine said phase errors.

14. The apparatus of claim 13 wherein:

said processing device is disposed to apply a Fourier transform to said overall k-space signal, in order to generate an image function representing said object and said point source collectively, in real space, said processing device being further disposed to define a region in said real space which contains said point source and excludes said object, and to apply an inverse Fourier transform to said image function which is spatially limited to said region, in order to generate said filtered k-space data set.

15. The apparatus of claim 14 wherein:

said processing device is further disposed to determine constant and linear phase errors between each k-space line of said reference k-space data set, and k-space lines respectively corresponding thereto of said filtered k-space data set.

16. The apparatus of claim 15 wherein:

said apparatus includes a control for operating said set of MR components to acquire said reference k-space data set while said point source is immovably located at a specified reference position with respect to said MR components.

17. The apparatus of claim 13 wherein:

said set of MR components comprises respective gradient and RF coils of an MR imaging system.

18. The apparatus of claim 14 wherein:

said MR component set is disposed to acquire a plurality of k-space alignment lines in parallel relationship to the phase encoding axis of said k-space, each of said alignment lines comprising a set of data points, the location of each data point of a given alignment line coinciding with a location of one of the data points included in said filtered k-space data set; and said processing device is disposed to derive filtered k-space alignment lines from said acquired k-space alignment lines to provide said reference k-space data set.

19. The apparatus of claim 18 wherein:

said processing device comprises means for obtaining said filtered k-space alignment lines by individually Fourier transforming said k-space alignment lines to obtain projections, from which said point source is separated from said object, said projections corresponding to said point source being inversely Fourier transformed.

20. The apparatus of claim 14 wherein:

said apparatus includes an RF point source coil positioned in proximate relationship with said point source to acquire k-space signals from said point source with selectively enhanced sensitivity.

* * * * *